United States Patent
Fritz et al.

(10) Patent No.: US 7,703,058 B2
(45) Date of Patent: Apr. 20, 2010

(54) METHOD AND SYSTEM FOR CHANGING A DESCRIPTION FOR A STATE TRANSITION FUNCTION OF A STATE MACHINE ENGINE

(75) Inventors: Rolf Fritz, Waldenbuch (DE); Markus Kaltenbach, Leinfelden (DE); Ulrich Mayer, Schoenbuch (DE); Thomas Pflueger, Leinfelden (DE); Cordt Starke, Weil der Stadt (DE); Jan Van Lunteren, Gattikon (CH)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 11/740,487

(22) Filed: Apr. 26, 2007

(65) Prior Publication Data

US 2007/0283300 A1 Dec. 6, 2007

(30) Foreign Application Priority Data

May 30, 2006 (EP) .................................. 06114682

(51) Int. Cl.
*G06F 17/50* (2006.01)
(52) U.S. Cl. ................. 716/5; 716/18; 703/16
(58) Field of Classification Search ............. 716/5, 716/18; 703/6, 16
See application file for complete search history.

(56) References Cited

U.S. PATENT DOCUMENTS

| | | | | |
|---|---|---|---|---|
| 5,469,367 A | * | 11/1995 | Puri et al. | 716/18 |
| 5,826,061 A | * | 10/1998 | Walp | 716/6 |
| 6,502,232 B1 | * | 12/2002 | Campenhout | 716/18 |
| 2008/0015838 A1 | * | 1/2008 | Stern | 703/15 |

* cited by examiner

*Primary Examiner*—Phallaka Kik
(74) *Attorney, Agent, or Firm*—Matthew C. Zehrer

(57) ABSTRACT

The invention relates to a method and system for the design and implementation of state machine engines. A first constraints checking step checks a state transition function created by a designer against constraints imposed by the implementation technology in order to detect all portions of the state transition function that are in conflict with the constraints. A subsequent conflict resolution step tries to determine one or more suggested ways to meet the conflicting constraints, by investigating how the original state transition function can be modified such that all constraints are met. A final presentation and selection step provides the designer textual and/or graphically results of the constraints check and suggested modifications. The modifications can be accepted interactively, or the state transition function can be changed manually. In the latter case, the modified state transition function will be processed starting again with the constraints checking step.

11 Claims, 8 Drawing Sheets

METHOD AND SYSTEM FOR CHANGING A DESCRIPTION FOR A STATE TRANSITION FUNCTION OF A STATE MACHINE ENGINE

BACKGROUND OF THE INVENTION

The present invention relates to the design and implementation of state machine engines in data processing systems.

A finite state machine (FSM) is a model of behaviour composed of states, transitions and actions. A state stores information about the past, i.e., it reflects the input changes from the start to the present moment. A transition indicates a state change and is described by a condition that would need to be fulfilled to enable the transition. An action is a description of an activity that is to be performed at a given moment. A specific input action is executed when certain input conditions are fulfilled at a given present state. For example, an FSM can provide a specific output (e.g., a string of binary characters) as an input action.

An FSM can be represented using a set of (state) transition rules that describes a state transition function. State transition diagrams are used to graphically represent FSMs. Classic forms of state transition diagrams are directed graphs, where each edge is a transition between two states and each vertex is a state. The inputs are signified on each edge.

Controllers in a broad spectrum of devices and systems are often based on state machine engines that implement a FSM. Emerging trends, including programmable accelerators etc., require the operation of these devices, and consequently also the controller operation, to be configurable and/or programmable. For this purpose, programmable state machine engines are used.

An example of such a programmable accelerator is the ZuXA accelerator concept described in a paper co-authored by one the inventors: Jan van Lunteren et al, "XML Accelerator Engine", Proc. of First International Workshop on High Performance XML Processing, 2004. ZuXA is based on the BaRT-based FSM (B-FSM) technology. BaRT (Balanced Routing-Table Search) is a specific hash table lookup algorithm described in a paper of one of the inventors: Jan van Lunteren, "Searching Very Large Routing Tables in Wide Embedded Memory", Proc. of GLOBECOM '01, pp. 1615-1619.

A ZuXA controller can be used to improve the processing of XML (extensible Markup Language) code. It is fully programmable and provides high performance in combination with low storage requirements and fast incremental updates. Especially, it offers a processing model optimized for conditional execution in combination with dedicated instructions for character and string-processing functions. The B-FSM technology describes a state transition function using a small number of state transition rules, which involve match and wildcard operators for the current state and input symbol values, and a next-state value. The transition rules are assigned priorities to resolve situations in which multiple transition rules are matching simultaneously.

FIG. 1 shows a block diagram of a subsystem of a controller comprising a state machine engine that implements a B-FSM (an FSM based on the BaRT hash table lookup operation). The transition rules are stored in a transition rule memory 10. A rule selector 11 reads rules from the rule memory 10 based on a given input vector and a current state stored in a state register 12. The transition rules stored in the rule memory 10 are encoded in the transition rule vector format shown in FIG. 2. A transition rule vector comprises a test part 20 and a result part 21. The test part 20 comprises fields for a current state 22, an input character 23 and a condition 24. The result part 21 comprises fields for a mask 25, a next state 26, an output 27, and a table address 28.

In a ZuXA controller the input to the rule selector 11 consists of a result vector provided by a component called instruction handler, in combination with a general-purpose input value obtained, for example, from an input port. In each cycle, the rule selector 11 will select the highest-priority transition rule that matches the current state stored in the state register 12 and the input vector. The result part 21 of the transition rule vector selected from the transition rule memory 10 will then be used to update the state register 12 and to generate an output value. The output value includes instructions that are dispatched for execution by the instruction handler component. The execution results are provided back to the rule selector 11 and used to select subsequent instructions to be executed by the instruction handler as described above.

FIG. 3 shows a more detailed block diagram of the state machine engine of FIG. 1. The transition rule memory 10 contains a transition rule table 13 that is implemented as a hash table. Each hash table entry of the transition rule table 13 comprises several transition rules that are mapped to the hash index of this hash table entry. The transition rules are ordered by decreasing priority within a hash table entry. An address generator 14 extracts a hash index from bit positions within the state stored in the state register 12 and input vectors that are selected by a mask stored in a mask register 15. In order to obtain an address for the memory location containing the selected hash table entry in the transition rule memory 10, this index value will be added to the start address of the transition rule table in this memory. This start address is stored in a table address register 16.

The function of the rule selector 11 is based on the BaRT algorithm, which is a scheme for exact-, prefix- and ternary-match searches. The BaRT search operation involves comparing the N=4 transition rule entries 30, 31, 32, 33 contained in each hash table entry 0 and 1 in parallel with the search key. The search key is build from the actual values of the state register 12 and the input vector, while taking potential "don't care" conditions indicated by the condition field 24 of the transition rule entries into account. The first matching transition rule vector is then selected and its result part field 21 is selected to become the search result.

Especially, in a ZuXA controller the search result can be used to generate an instruction vector for the instruction handler that provides processing results back to the state machine engine as part of an input vector. The instructions contained in the instruction vector can be used for simple (and fast to be implemented) functions that run under tight control of the state machine engine. Examples are character- and string processing functions, encoding, conversion, searching, filtering, and general output generating functions.

Compared to other applications in which state machine engines are used, controllers embedded in larger systems often involve a much wider input vector to the state machine engine that is comprised of "status" and result information of a multitude of logic functions and components that are controlled by the state machine engine. For example, such embedded controllers are used in computer systems to perform parsing and pattern matching operations on a given stream of network data in order to offload these tasks from the central processors. The U.S. patent application 2004/0042487 A1 describes such a network traffic accelerator system and method.

For usual pattern-matching and parsing applications on the other hand, the input to the state machine engine often consists only of a single character in each clock cycle, a single byte in case of standard encodings such as ASCII (American Standard Code for Information Interchange). Support of wider input vectors as needed for a network traffic accelerator system, for example 32 bits, is much harder to implement in an efficient way at high processing rates, than to implement a state machine engine which processes input vectors consisting of only 8 bits, mainly because of the much larger set of possible input values that can occur. Due to the high clock frequencies of today's processors it is therefore a challenging task to provide a ZuXA controller implementation for the use as a network traffic accelerator in computer systems with such high speed processors.

In practice, however, often only a subset of the entire set of possible input values will be used, and consequently, the state machine engine design can be optimized for that given subset. One example is to use a hash function for selecting state transitions, which only considers certain groups of bits from the input value. Another example would be to assume that from most states (e.g., 95%), at most a certain number (e.g., 4) of transitions can be made, each labeled with a certain input value.

A similar approach related to logic synthesis methods is described in a technical disclosure published as IPCOM121980D. Logic synthesis is a process by which an abstract form of desired hardware logic circuit behaviour (typically at the so-called register transfer level or behavioural level) is turned into a circuit design implementation in terms of logic gates. Common examples of this process include synthesis of hardware description languages (e.g., VHDL or Verilog). In a logic synthesis tools chain, an FSM compiler is used to process a state transition table (or other specified input formats) and derives a sum-of-products equation for each output and for each bit of the storages (e.g., latches) used to represent the state of an FSM.

Since it is not possible for a simple FSM compiler alone to determine if a particular FSM contains sub-paths of a timing critical path in the circuit design implementation, but this information is usually known to the logic designer, the logic designer can provide this information to the FSM compiler. The FSM compiler can then use this information to reorder the sum-of-products equations to reduce the delay of the critical sub-path based on the designer's "coaching".

There exist several others of these examples corresponding to a variety of different techniques that can be used to implement a state machine engine. In all cases the subset of the possible input values is specified by certain constraints for the set of possible input values. It is therefore beneficial to optimize the state machine engine implementation for that given subset of possible input values, enabling an efficient and fast implementation, rather than trying to cover all possible input values, resulting in an expensive and slow implementation. However a problem exists wherein some of the input values, or combinations of input values, are not supported by the state machine engine implementation.

SUMMARY OF THE INVENTION

In particular embodiments of the present invention a method for the implementation of state machine engines, a corresponding computer program and computer program product are described.

The advantages of the present invention are achieved by a method of checking a state transition function specification created by a designer, and resolving any constraint conflicts in an interactive way. FIG. 4 shows a block diagram of an illustrative data flow in which a constraints checker and conflict resolution tool implementing a method in accordance to the present invention is executed before the actual implementation of the state transition function is performed by an existing state transition function implementation tool.

The input to the constraints checker and conflict resolution tool consists of a state transition function specification created by a designer, which can be described in various ways, but typically consists of a state transition table, listing all state transitions together with their originating and destination states, input and output values. An alternative description can consist for example of a list of state transition rules, involving wildcards and priorities.

The output of the constraints checker and conflict resolution tool consists of a similar state transition function specification, which meets all constraints that are imposed by the state transition function implementation tool. The latter tool will generate an implementation of the state transition function based on that specification. The actual operation of the implementation tool and corresponding constraints are dependent on the implementation technology.

For example, prior art methods for implementing non-programmable state machine engines typically use a register in combination with combinatorial logic that implements the associated state transition function. In this case, the implementation tool can generate a specification of the combinatorial logic that can be used by logic synthesis tools for the creation of a physical implementation of the state machine engine the implements the state transition function.

Prior art methods for implementing programmable state machine engines allow programming a state transition function by modifications of a RAM (Random Access Memory), for example, by storing the next states for each combination of a current state and input value in a large table, or alternatively, by applying a hash function as done in the ZuXA architecture, wherein the implementation tool will generate a data structure that is written into the RAM.

The constraints checker and conflict resolution tool implements the following three basic subsequent steps:

A constraints checking step implemented by a method that checks the state transition function that is created by a designer, against the constraints that are imposed by the implementation technology, and detects all portions of the state transition function that do not meet these constraints (conflicting constraints).

A conflict resolution step implemented by a method that tries to determine one or more suggested ways to meet the conflicting constraints by investigating how the original state transition function can be modified such that all constraints are met.

A presentation and selection step implemented by a method of presenting to the designer in a textual and/or graphical way both the results of the constraints check performed in the first step, in particular the portions of the state-transition diagram that do not meet the constraints, and the suggested modifications determined in the conflict resolution step. The designer can respond interactively by indicating that he accepts one of the suggested modifications, or can modify the state transition function manually. In the former case, the constraints check and conflict resolution is completed. In the latter case, the modified (portions of the) state transition function will be processed, starting again with the constraints checking step.

BRIEF DESCRIPTION OF THE DRAWINGS

The present invention and its advantages are now described in conjunction with the accompanying drawings.

It is to be noted, however, that the appended drawings illustrate only example embodiments of the invention, and are therefore not considered limiting of its scope, for the invention may admit to other equally effective embodiments.

DETAILED DESCRIPTION

Figure 1:
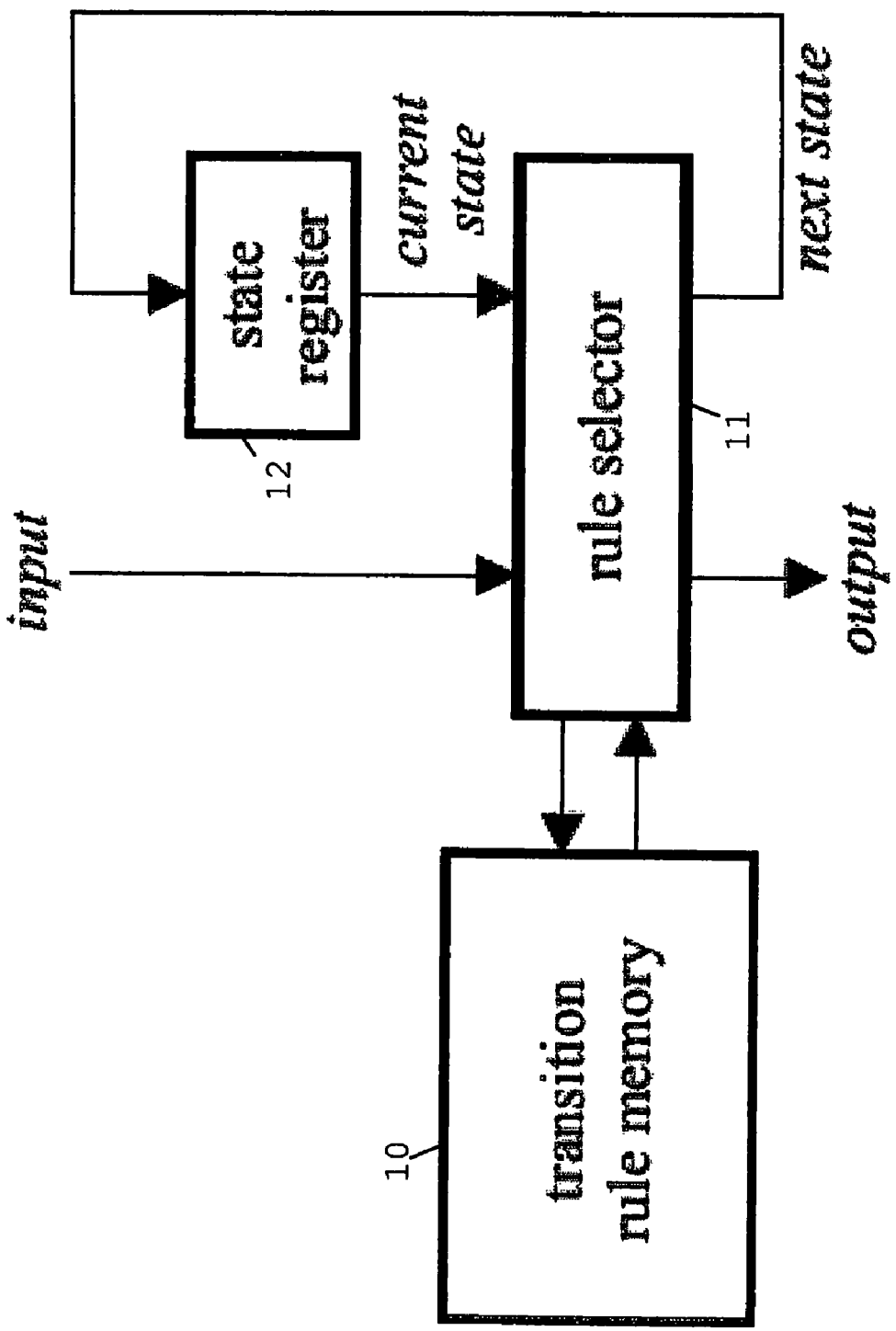
FIG. 1: Is a block diagram of a subsystem of a B-FSM controller.
Figure 2:
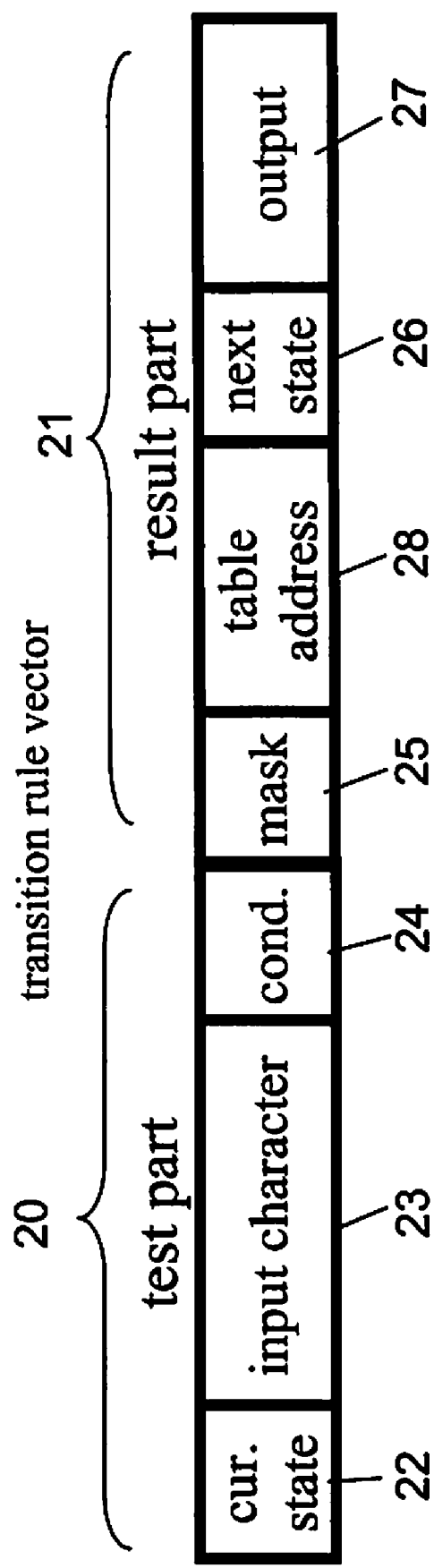
FIG. 2: Is a block diagram of a transition rule vector format.
Figure 3:
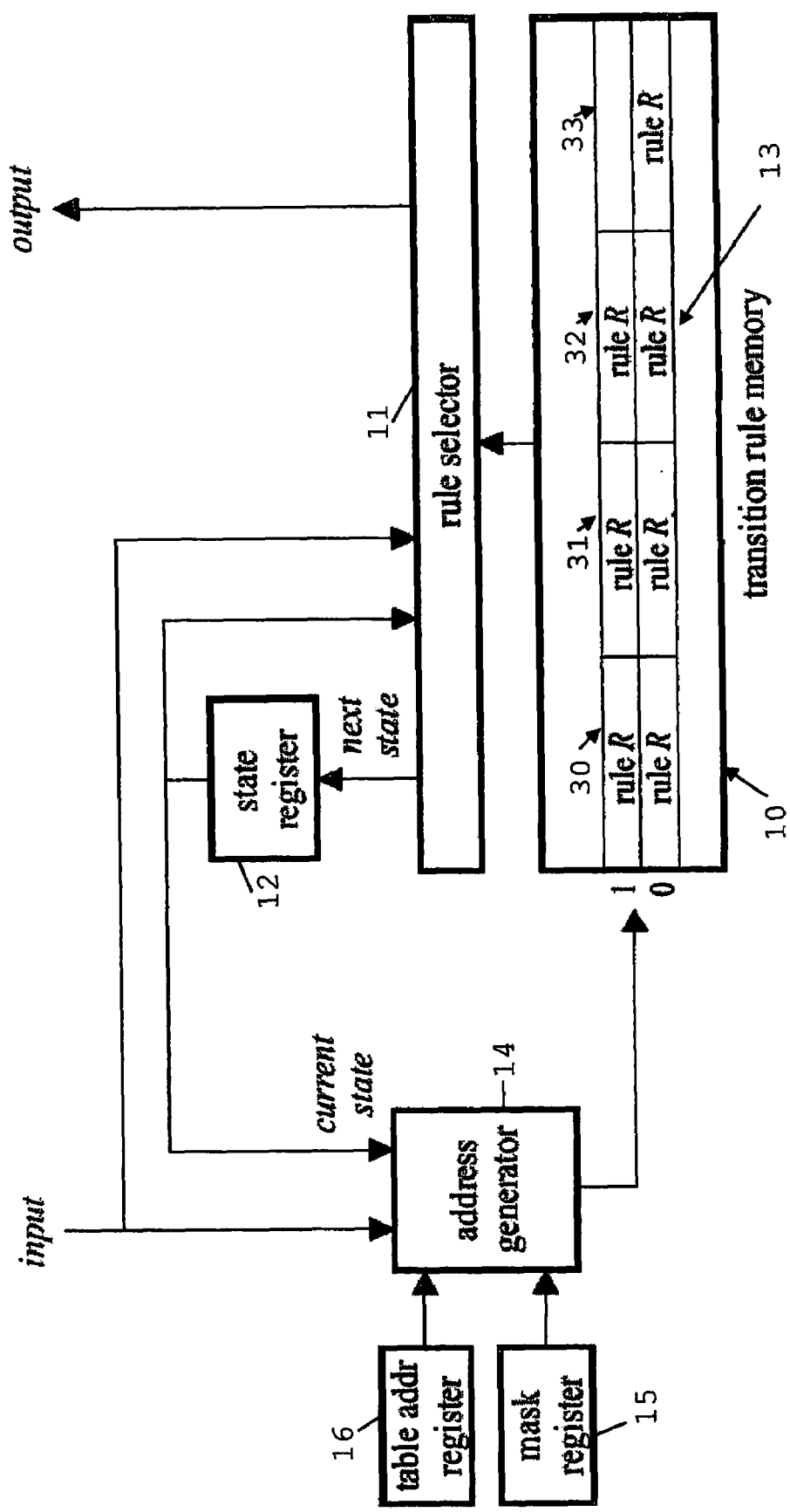
FIG. 3: Is a block diagram of a subsystem of a B-FSM controller.
Figure 4:
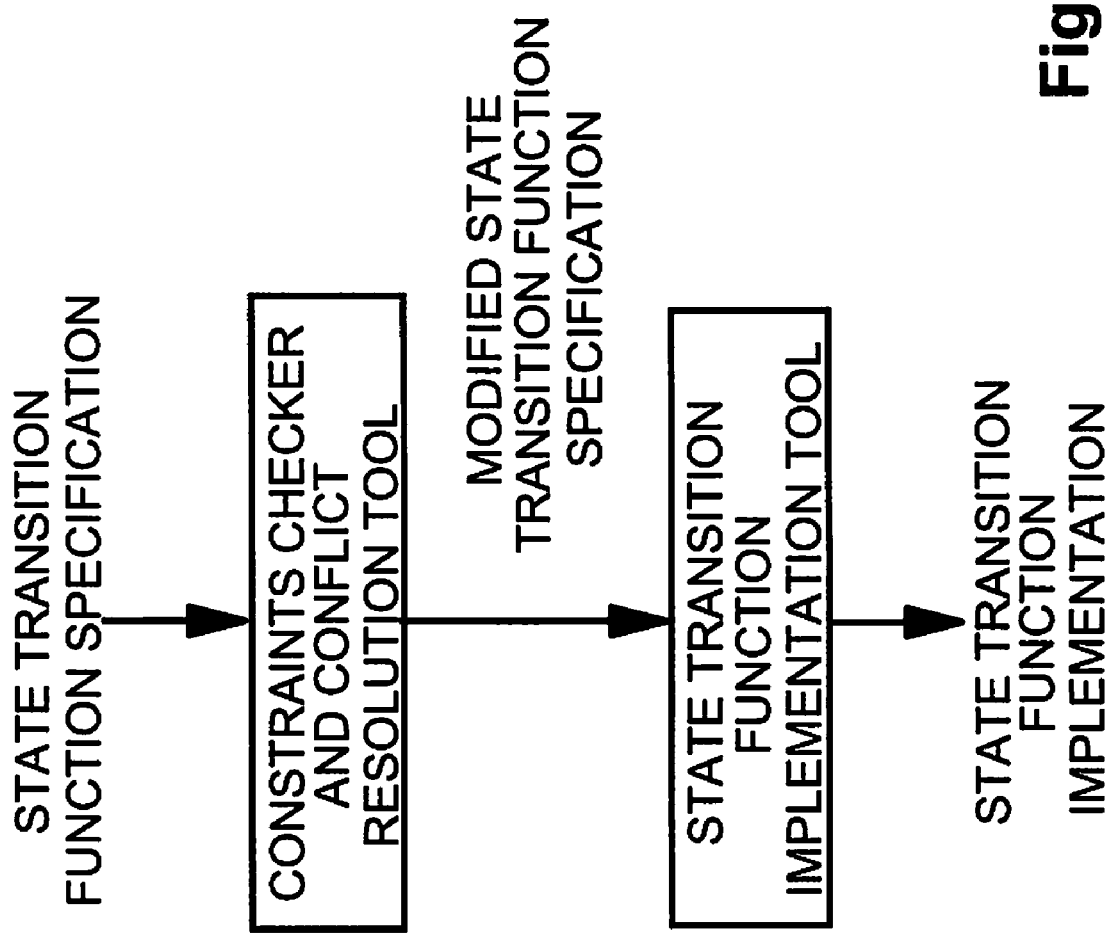
FIG. 4: Is a block diagram illustrating a data flow in accordance with the present invention.
Figure 5:
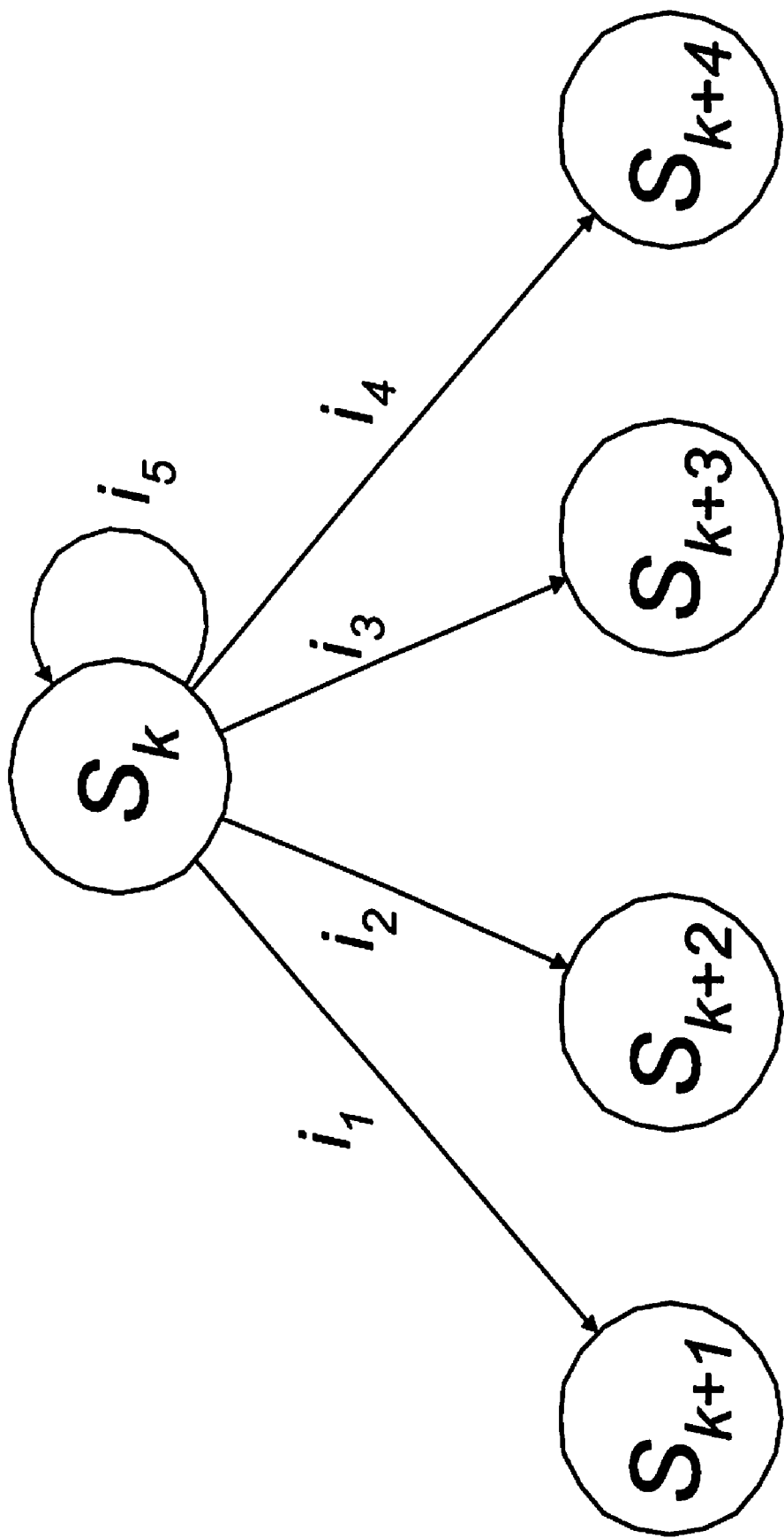
FIG. 5: Is a state transition diagram.
Figure 6:
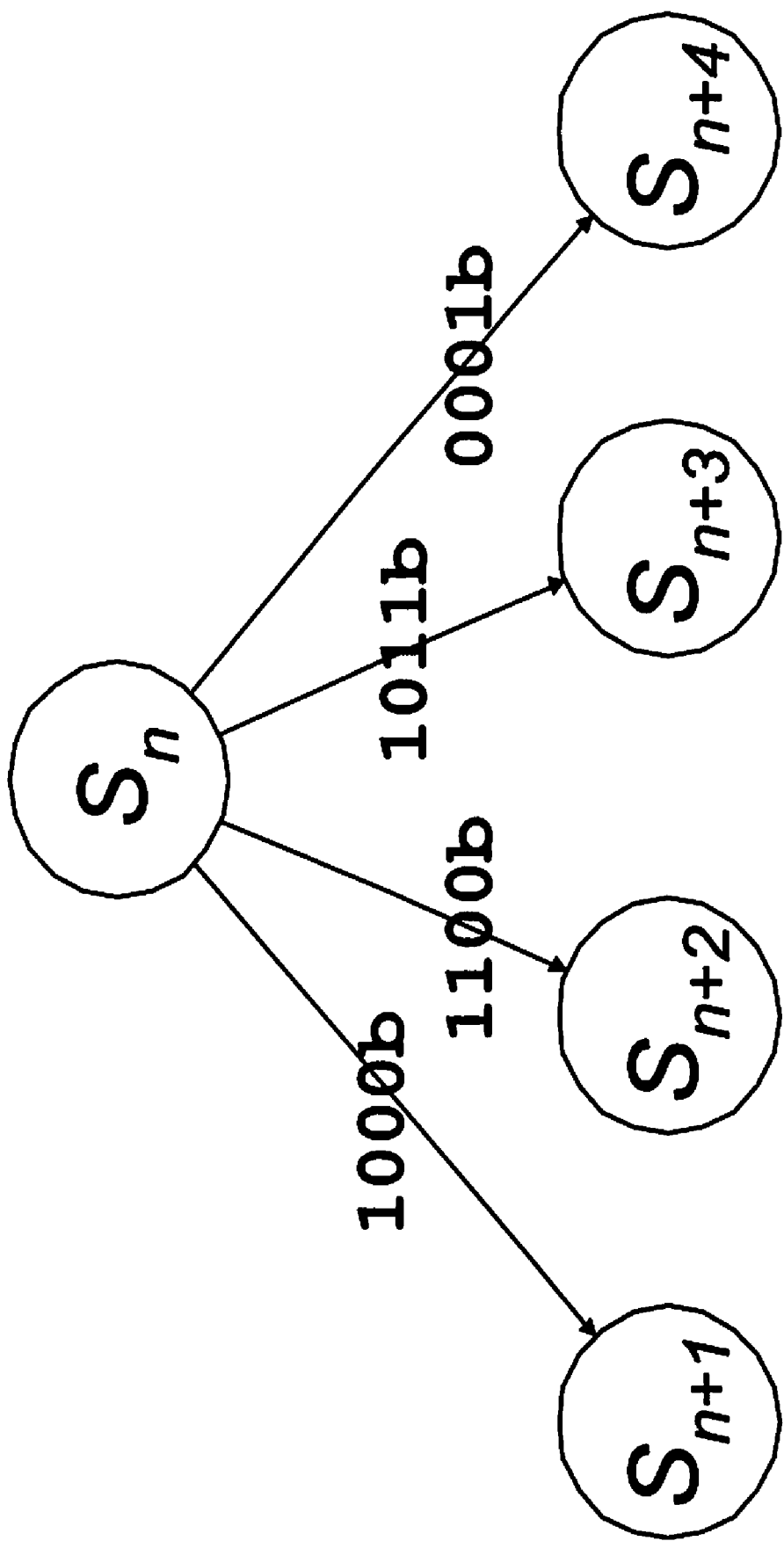
FIG. 6: Is a state transition diagram.

In a first preparing step, a designer of a state machine engine needs to specify the state transition function for the FSM implemented by the state machine engine. FIGS. 5 and 6 are examples for state transition diagrams. In both figures $S_k$ and $S_n$ represent states, $i_1$ to $i_5$ represent some given input vector, and 1000b to 0001b represent a set of input vectors in binary representation.

The state diagram in FIG. 5 illustrates the following list of state transitions:

$S_k i_1 \rightarrow S_{k+1}$
$S_k i_2 \rightarrow S_{k+2}$
$S_k i_3 \rightarrow S_{k+3}$
$S_k i_4 \rightarrow S_{k+4}$
$S_k i_5 \rightarrow S_k$ Whereas the state diagram in FIG. 6 illustrates the following list of state transitions:

$S_n$ 1000b $\rightarrow S_{n+1}$
$S_n$ 1100b $\rightarrow S_{n+2}$
$S_n$ 1011b $\rightarrow S_{n+3}$
$S_n$ 0001b $\rightarrow S_{n+4}$ For the preferred embodiment of the present invention, the list of state transitions needs to be derived from a state transition function description provided by the designer. This preparing step can be performed using well-known methods. The list of state transitions will then be checked against certain types of constraints for the state transitions. This step is called the constraints checking step.

For the preferred embodiment of the invention at least two types of constraints for state transitions are supported. The first constraint type consists of an upper bound on the total number of state transitions that originate from the same state. The second constraint type involves limitations on the input vectors that are associated with the state transitions from the same state, in particular the bit positions in which these can be different. Additional constraint types are not excluded and can be handled in a similar way.

For the first type of constraint, an array of counters, one for each state, each of which represents the number of transitions corresponding to that state, is created. The initial value of each counter is zero. While processing the list of state transitions, the counter corresponding to the "current" state involved in each transition processed will be incremented. In case of a wildcard condition for the current state, all counters in the array will be incremented, as this state transition relates to all states. After incrementing a counter, it will be checked if the counter value is greater than the specified bound. If so, the corresponding state will be recorded as being in conflict with the constraint.

For example, if a constraint is specified that limits the number of state transitions to at most 4 transitions per state, it will be determined for the state diagram shown in FIG. 5, that state $S_k$ has 5 transitions and consequently conflicts with this constraint.

For the second type of constraint, a set will be created for each state. These sets contain all input values that correspond to the state transitions of the particular state. Then the logical exclusive-or-product (XOR-product) for each combination of input values in that set is created, which reflects the bits in which the input values are different from each other. The actual constraint, i.e., the limitation on the bit positions in which the various input values are different from each other are then checked on the XOR products.

For example, for state $S_n$ shown in FIG. 6 the following set of input values that corresponds with the four transitions of state $S_n$ is created:

i) {1000b, 1100b, 1011b, 0001b}

The XOR-product is then determined for each combination of input values:

i) XOR-product 1: 1000b xor 1100b=0100b
ii) XOR-product 2: 1000b xor 1011b=0011b
iii) XOR-product 3: 1000b xor 0001b=1001b
iv) XOR-product 4: 1100b xor 1011b=0111b
v) XOR-product 5: 1100b xor 0001b=1101b
vi) XOR-product 6: 1011b xor 0001b=1010b The "1"/set-bits in the XOR-product indicate the bit positions at which the various input values are different from each other. All constraints of the second type can now be directly checked against the XOR-products.

For example, if the constraint would be that the input values should be different at a maximum of two bit positions, then this would mean that all XOR-products would include at most two set-bits. This is verified by counting the set-bits in each of the XOR-products. In the above example, it will be detected that XOR-products 4 and 5 are conflicting with this constraint, because these contain three set bits, meaning that the corresponding input values 1100b, 1011b, and 0001b are different from each other at more than two bit locations (as can be directly verified).

In a similar way, constraints can be checked that limit the bit positions in which the differences are allowed to occur, to specific locations within the input vectors. For example, a constraint could specify that bit differences are not allowed to occur at bit position 0 (which is the left-most bit in the above binary vectors). For this version of the constraint, each XOR-product is tested to have only set bits at the bit positions at which differences are allowed to occur. Any set bit at a different bit location will result in the identification of a conflict with the constraint. For example, for the constraint described above, XOR-products 3, 5 and 6 are conflicting, because these contain a set-bit at bit position 0, indicating that the corresponding input vectors are different from each other at this given bit position.

The next step after the constraints checking step described above is called the conflict resolution step. In this step potential modifications of the state transition function are derived that would resolve the conflict situation and create a state transition function that meets all constraints. These potential modifications are then suggested to the designer. The derivation of potential modifications that resolves the conflicting constraints is performed separately for the two (or more) constraint types described above.

If the number of transitions for a single state exceeds a specified bound (the first constraint type), then this can be resolved potentially by creating an additional state and transferring all the "excess" number of transitions plus one, to that new state, while a new transition is created from the original state to the new state that will be used if none of the remaining transitions are taken (which are within the specified bound). If the number of transitions of the new state also exceeds the limit imposed by the constraint, the same procedure is iterated on the new state as well.

It is now explained using the state transition function of FIG. 5. In this case, state $S_k$ has 5 transitions and consequently conflicts with the constraint that limits the number of transitions per state to a maximum of 4 transitions. Based on the above described conflict resolution step, this part of the state transition function can be modified to become the state transition function of the state transition diagram shown in FIG. 7. In this state transition diagram a new state $S_k'$ has been inserted, to which the "excess" number plus one, which equals two transitions have been transferred. A transition will be made from the original conflicting state $S_k$ to the new state $S_k'$ if none of the transitions that remain "at" state $S_k$ are used. This "else" transition is taken if the input value does not equal $i_1$, $i_2$, or $i_5$ as shown in FIG. 5.

Figure 7:
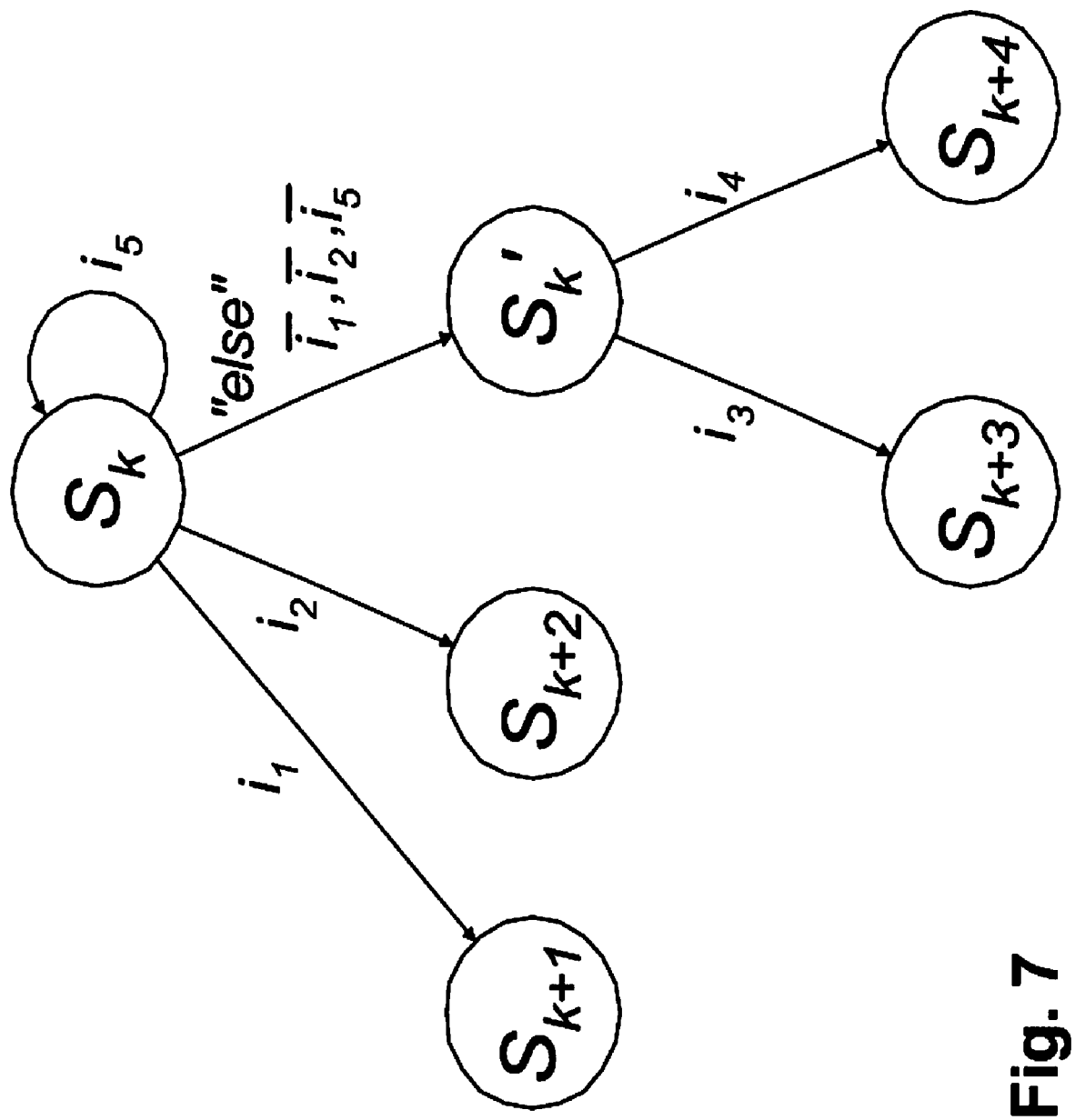
FIG. 7: Is a state transition diagram derived from the state transition diagram of FIG. 5 in accordance with the present invention.

Such an "else"-transition is created using the B-FSM technology, by assigning it $S_k$ as current state, a wildcard as input value, $S_k'$ as next state, and a priority that is lower than the other transitions that originate in state $S_k$. Furthermore, this "else" transition will not process an input value, but indicates using an instruction/output bit, that the input is put on hold, so that the current input value can be evaluated again for determining the transition to be taken from state $S_k'$. FIG. 7 shows one potential modification only. In this case, various modifications are possible, involving different transitions with input values to be transferred to the new state (e.g., the transitions with input values $i_1$ and $i_2$ or any other combination).

The second constraint type relates to the bit positions in which the input values are allowed to be different from each other. In case a conflict has been detected, then a potential modification of the state transition function can be suggested, that transfers one or multiple transitions to a new state, similar as described above for resolving conflicts for the first constraint type. However, in this case, a minimum number of state transitions will be selected for transfer to the new state, in order to meet the constraint. The latter is done by the following steps:

Step 1: A new state is created.

Step 2: In the list of XOR-products for a given state that conflicts with a constraint of this type, it is determined which transition and associated input value occur most frequently in the "problematic" XOR-products.

Step 3: This transition and input value is transferred to the new state.

Step 4: The list of XOR-products is recalculated, and any conflicts are determined.

Step 5: If there are no conflicts left, then go to step 6. If there are conflicts left then go to step 2.

Step 6: Create the "else" transition from the original conflicting state to the new state.

Figure 8:
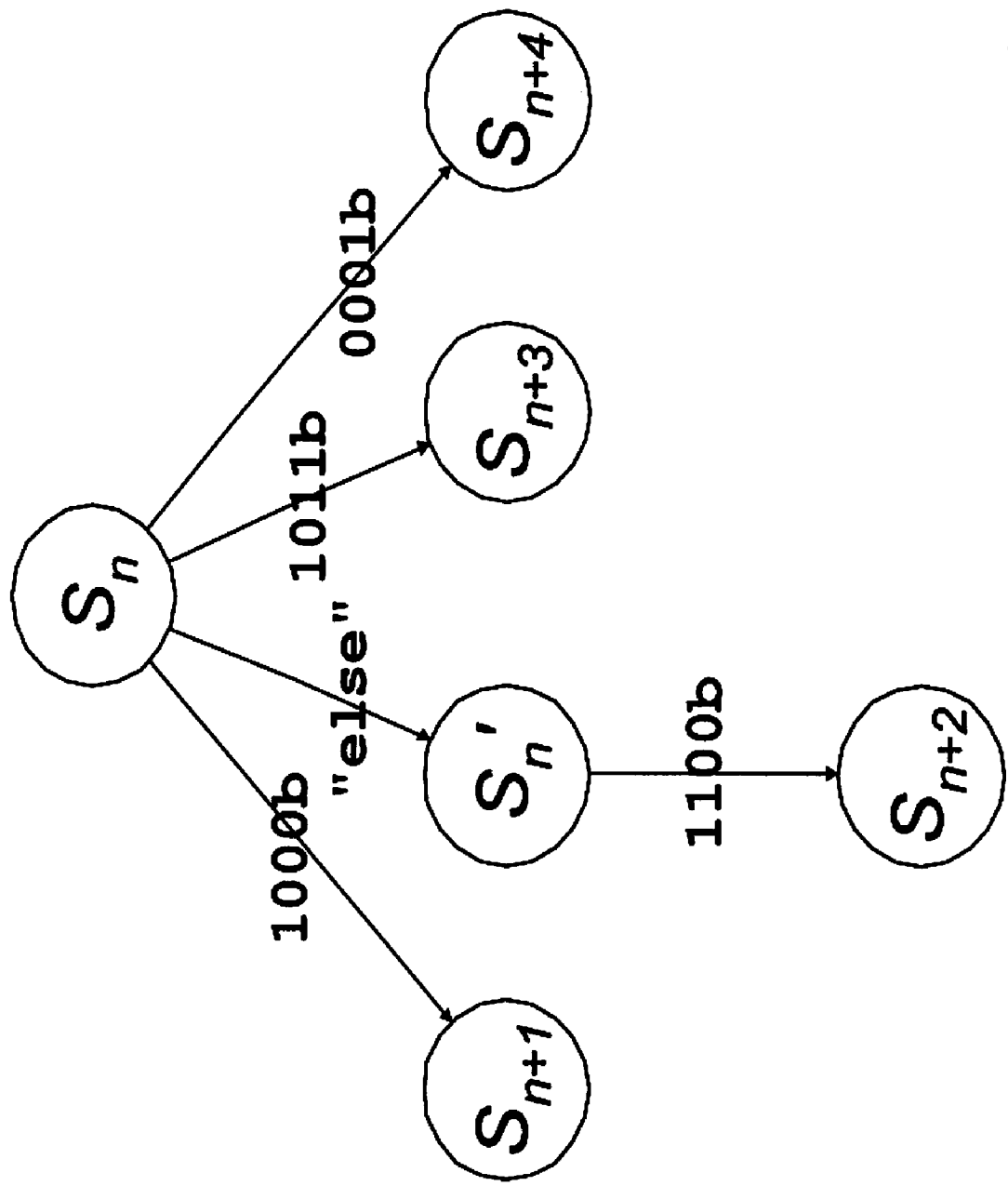
FIG. 8: Is a state transition diagram derived from the state transition diagram of FIG. 6 in accordance with the present invention.

Applying this method on the above discussed example for the constraints checking step related to FIG. 6, involving the constraint that the input values should only be different at a maximum of two bit positions, would result in input value 1100b being identified as the input value that most frequently occurs in the problematic XOR-products, namely XOR-products 4 and 5. The corresponding state transition is transferred to a new state as shown in FIG. 8. In this case, the "else" transition is created using a wildcard for the input value, which consequently does not conflict with the other transitions from state $S_n$, and also has a lower priority.

The new state and "transferred" transitions are also checked against all constraints, and if a conflict is found, the above described procedures are repeated to identify potential modifications of the state transition function that resolves the conflict.

The final presentation step involves the presentation to the designer of the conflicting constraints that were identified in the first step, as well as the suggested modifications of the state transition function that were identified in the conflict resolution step.

The presentation can consist of a textual listing of the state number or identifier plus the corresponding list of state transitions, together with an error number indicating the conflicting constraint. It can also include a graphical representation of a corresponding state transition diagram or a portion of it, high-lighting the conflicting states and state transitions.

The suggested modifications can be presented in a similar way: textual or graphical. The designer can then indicate by responding to a question, such as "Do you accept the proposed modification?" or the like. If the designer responds, e.g., by pushing a button labeled "YES" on a computer screen to indicate an accepting answer, the modification is accepted; otherwise the designer is provided with the option to make the modifications manually. In case of multiple conflicting constraints, the designer has to respond for each conflict found. If multiple modifications are suggested, then these will be labeled with a number, and the designer can select which of the suggested modifications he accepts or reject all of them.

The invention can also be used without a presentation and selection step. In that case the automatically determined modifications to the state transition function are accepted without any interactions. The modified state transition function is represented as a list of state transitions. Such a list can be transformed in a description of the modified state transition function suitable as an input to existing tools using well-known methods.

Especially, the invention can be used in conjunction with a ZuXA controller. The state transition function for the FSM is then specified by the designer as a set of transition rules. A constraints checker and conflict resolution tool executed on a computer system implements a method in accordance with the present invention, the method comprising the constraints checking step, the conflict resolution step, and the presentation step. The input to this tool is a set of transition rules which are modified using this tool to another set of transition rules. This set of transition rules is then processed by a transition rule compiler that serves as a transition function implementation tool.

The B-FSM algorithm can distribute the state transition rules in various ways over the hash table entries, and consequently, over the cache lines (upon which these hash table entries are mapped), by extracting the hash index from various bit positions (which is achieved by using various index masks) and by using various state encodings. The function that generates the data structure, which includes performing this mapping, is called the transition rule compiler.

The transition rule compiler creates data structures that can be loaded to a transition rule memory. The designer selects the modifications to the state transition function presented by the constraints checker and conflict resolution tool on an input mask presented by the computer system.

The invention can take the form of an entirely hardware embodiment, an entirely software embodiment or an embodiment containing both hardware and software elements. In an embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computer processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

While a particular embodiment has been shown and described, various modifications of the present invention will be apparent to those skilled in the art.

The invention claimed is:

1. A computer-based method for changing a description for a predefined state transition function of a state machine engine, the method comprising the steps of:
   a) checking a predefined state transition function against a set of new constraints in order to detect conflicts;
   b) determining a set of modifications to a description of the predefined state transition function for each detected conflict, wherein a resulting state transition function is no longer in conflict with the constraint associated with the conflict; and
   c) creating with a computer a description for a modified state transition function for the state machine engine from the description of the predefined state transition function and the set of modifications.

2. The method of claim 1, wherein the steps a, b, and c are subsequently performed for the description for the modified state transition function.

3. The method of claim 1, wherein the step of creating a description for a modified state transition function further comprises a step of:
   c1) presenting each detected conflict and the associated set of modifications to a user for acceptance for each associated set of modifications.

4. The method of claim 3 wherein the step of creating a description for a modified state transition function further comprises the steps of:
   c2) when a set of modifications for a detected conflict is not accepted by the user,
      replacing the associated set of modifications by a user-provided set of modifications;
      creating a description for an intermediate modified state transition function for the state machine engine from the description of said state transition function and the sets of modifications;
      subsequently performing steps a, b, and c for the description for the intermediate modified state transition function;
   c3) creating a description for a modified state transition function for the state machine engine from the description of the state transition function and the sets of modifications.

5. The method of claim 4, wherein the set of constraints comprises an upper bound on a total number of state transitions originating from the same state.

6. The method of claim 5, wherein in step b, when it is detected that the state transition function is in conflict with a constraint from the set of constraints for a detected state, additional states and transitions to these additional states are introduced as part of a set of modifications in order to reduce a number of state transitions that originate from said detected state.

7. The method of the claim 6, wherein the set of constraints comprises limitations on inputs determining a state transition.

8. The method of claim 5, wherein in step b, when it is detected that said state transition function is in conflict with a constraint from said set of constraints for a detected state transition, additional states and state transitions are introduced as part of a set of modifications in order to resolve limitations on inputs determining said detected state transition.

9. A computer program product comprising a computer storage device embodying program instructions executable by a computer, the program instructions comprising the computer program to perform the steps of:
   a) checking a predefined state transition function against a set of new constraints in order to detect conflicts;
   b) determining a set of modifications to a description of the predefined state transition function for each detected conflict, wherein a resulting transition function is no longer in conflict with the constraint associated with the conflict; and
   c) creating a description for a modified state transition function for the state machine engine from the description of the predefined state transition function and the set of modifications.

10. The computer program product of claim 9, wherein the step of creating a description for a modified state transition function further comprises a step of:
   c1) presenting each detected conflict and the associated set of modifications to a user for acceptance for each associated set of modifications.

11. The computer program product of claim 10 wherein the step of creating a description for a modified state transition function further comprises the steps of:
   c2) when a set of modifications for a detected conflict is not accepted by the user,
      replacing the associated set of modifications by a user-provided set of modifications;
      creating a description for an intermediate modified state transition function for the state machine engine from the description of said state transition function and the sets of modifications;
      subsequently performing steps a, b, and c for the description for the intermediate modified state transition function;
   c3) creating a description for a modified state transition function for the state machine engine from the description of the state transition function and the sets of modifications.

* * * * *